(12) United States Patent
Stroomer et al.

(10) Patent No.: US 7,386,814 B1
(45) Date of Patent: Jun. 10, 2008

(54) TRANSLATION OF HIGH-LEVEL CIRCUIT DESIGN BLOCKS INTO HARDWARE DESCRIPTION LANGUAGE

(75) Inventors: Jeffrey D. Stroomer, Lafayette, CO (US); Roger B. Milne, Boulder, CO (US); Isaac W. Foraker, Longmont, CO (US); Sean A. Kelly, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 337 days.

(21) Appl. No.: 11/054,864

(22) Filed: Feb. 10, 2005

(51) Int. Cl.
*G06F 17/50* (2006.01)

(52) U.S. Cl. .................. 716/3; 716/2; 703/14; 703/15; 703/16

(58) Field of Classification Search ............... 716/2–3; 703/14–16
See application file for complete search history.

(56) References Cited

U.S. PATENT DOCUMENTS

| | | | | |
|---|---|---|---|---|
| 5,111,413 A * | 5/1992 | Lazansky et al. | ............. | 703/14 |
| 5,404,319 A * | 4/1995 | Smith et al. | .................. | 716/18 |
| 6,135,647 A * | 10/2000 | Balakrishnan et al. | ........ | 716/18 |
| 6,204,686 B1 * | 3/2001 | Agrawal et al. | ............. | 326/39 |
| 6,216,258 B1 * | 4/2001 | Mohan et al. | ................ | 716/17 |
| 6,223,142 B1 * | 4/2001 | Bargh et al. | ................... | 703/15 |
| 6,304,790 B1 * | 10/2001 | Nakamura et al. | ............ | 700/97 |
| 6,317,860 B1 * | 11/2001 | Heile | ............................ | 716/5 |
| 6,321,369 B1 * | 11/2001 | Heile et al. | ................... | 716/11 |
| 6,336,211 B1 * | 1/2002 | Soe | ............................. | 717/108 |
| 6,408,264 B1 * | 6/2002 | Su et al. | ....................... | 703/14 |
| 6,430,732 B1 * | 8/2002 | Hwang et al. | ................ | 716/11 |
| 6,536,024 B1 * | 3/2003 | Hathaway | ....................... | 716/6 |
| 6,539,536 B1 * | 3/2003 | Singh et al. | .................. | 716/18 |
| 6,598,209 B1 * | 7/2003 | Sokolov | ........................ | 716/4 |
| 6,618,839 B1 * | 9/2003 | Beardslee et al. | ............ | 716/4 |
| 6,735,742 B2 * | 5/2004 | Hatsch et al. | .................. | 716/2 |
| 6,842,888 B2 * | 1/2005 | Roberts | ....................... | 716/18 |
| 6,857,110 B1 * | 2/2005 | Rupp et al. | .................... | 716/4 |
| 6,951,003 B2 * | 9/2005 | Barbee et al. | ................ | 716/10 |
| 6,993,138 B1 * | 1/2006 | Hardjono | .................... | 380/281 |
| 7,003,751 B1 * | 2/2006 | Stroomer et al. | ............. | 716/11 |
| 7,007,261 B1 * | 2/2006 | Ballagh et al. | ............... | 716/17 |
| 7,036,106 B1 * | 4/2006 | Wang et al. | .................. | 716/18 |
| 7,076,416 B2 * | 7/2006 | Chen et al. | ................... | 703/15 |
| 7,111,274 B1 * | 9/2006 | Edwards et al. | ............. | 716/18 |
| 7,143,369 B1 * | 11/2006 | Milne | ............................ | 716/4 |
| 7,143,376 B1 * | 11/2006 | Eccles | ........................... | 716/5 |

(Continued)

OTHER PUBLICATIONS

Xilinx, Inc.; U.S. Appl. No. 10/741,977 by Stroomer et al.; filed on Dec. 18, 2003.

*Primary Examiner*—Jack Chiang
*Assistant Examiner*—Naum Levin
(74) *Attorney, Agent, or Firm*—LeRoy D. Maunu; Lois D. Cartier

(57) ABSTRACT

Translation of high-level design blocks into a design specification in a hardware description language (HDL). Each block in the high-level design is assigned to a group. A set of attributes is identical between the blocks in a group. For each group of blocks, a respective set of parameters having different values on subblocks of at least two blocks in the group is determined. An HDL specification is generated for each group. The HDL specification for a group has for each parameter in the set of parameters, a parameter input.

7 Claims, 4 Drawing Sheets

U.S. PATENT DOCUMENTS

| | | | |
|---|---|---|---|
| 7,178,112 B1 * | 2/2007 | Ciolfi et al. | 716/1 |
| 7,184,946 B2 * | 2/2007 | Ballagh et al. | 703/23 |
| 7,203,632 B2 * | 4/2007 | Milne et al. | 703/14 |
| 7,203,922 B2 * | 4/2007 | Hamilton et al. | 716/18 |
| 7,257,525 B2 * | 8/2007 | McGaughy | 703/14 |
| 2002/0162097 A1 * | 10/2002 | Meribout | 717/155 |
| 2003/0033588 A1 * | 2/2003 | Alexander | 717/107 |
| 2003/0188299 A1 * | 10/2003 | Broughton et al. | 717/141 |

\* cited by examiner

TRANSLATION OF HIGH-LEVEL CIRCUIT DESIGN BLOCKS INTO HARDWARE DESCRIPTION LANGUAGE

FIELD OF THE INVENTION

The present invention generally relates to generating hardware description language code from design blocks of a high-level modeling system.

BACKGROUND

A high-level modeling system (HLMS) allows a user to assemble, simulate, and debug an electronic circuit design. One example of an HLMS is the tool System Generator, produced by Xilinx, Inc.

An electronic circuit design in an HLMS is generally assembled from objects known as blocks. Each block performs a desired function in the design, and the blocks are connected to accomplish the overall function of the design. Some blocks, known as leaves, have no subblocks. Collections of leaves, called libraries, are often supplied to users as built-in parts of an HLMS. For example, several blocks representing various kinds of finite impulse response (FIR) filters are supplied in libraries that are part of System Generator. Other blocks, called non-leaves, are assembled by users and may have a hierarchy of sub-blocks. Non-leaves are constructed by grouping and connecting several blocks. The blocks that are collected in a non-leaf may be leaves or non-leaves.

HLMSs usually translate designs into electronic hardware. Many times this hardware is expressed using a hardware definition language (HDL) such as VHDL or Verilog. A design in VHDL (or comparably, Verilog) consists of objects called entities (modules in Verilog). Entities are generally low-level HDL equivalents to HLMS blocks. A basic approach to translating an HLMS design produces at least one entity per block, and sometimes more. Since an HLMS design can contain tens or even hundreds of thousands of blocks, many entities may be generated.

The HDL generated by an HLMS is processed by downstream tools such as synthesis compilers, HDL simulators, and design browsers. The amount of memory and processing time needed by a downstream tool are directly related to the number of entities compiled. Also, users of an HLMS may want to examine the generated HDL directly. When the HDL contains many entities, it can be nearly impossible for a user to understand.

SUMMARY OF THE INVENTION

The various embodiments of the invention provide methods, system and apparatus for translating high-level design blocks into a design specification in a hardware description language (HDL). Each block in the high-level design is assigned to a group. Each block in a group has a first set of attributes identical to the first set of attributes of each other block in the group. For each group of blocks, a respective set of parameters having different values in at least two blocks in the group is determined. An HDL specification is generated for each group. The HDL specification for a group has for each parameter in the set of parameters, a parameter input.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

The various embodiments of the invention provide an efficient translation of a design from a high-level modeling system (HLMS) into HDL. HDLs such as VHDL and Verilog permit several lower level blocks to be implemented with a single construct in the language. For example, using parameters known as "generics" on VHDL entities makes it possible for several blocks to share the same entity. An analogous mechanism exists in Verilog. Blocks of the high-level design that can share the same entity are identified, and a single entity is generated which can be used for defining those blocks in HDL. More specifically, each nonleaf block in the high-level design is assigned to a group (or "family"), and a single entity is created that implements every block in the family. Families are constructed such that two blocks belong to the same family when the blocks differ only in the parameterizations of the constituent subblocks. For each family, the full set of differing subblock parameters is determined, and each such subblock parameter is added as a parameter to the HDL entity for the family.

Those skilled in the art will appreciate that even though the various embodiments are described in terms of VHDL and "entities," the invention is suitable for generating other types of HDL code such as Verilog, SystemC, JHDL (Java based HDL), and other hardware description languages.

Figure 1:
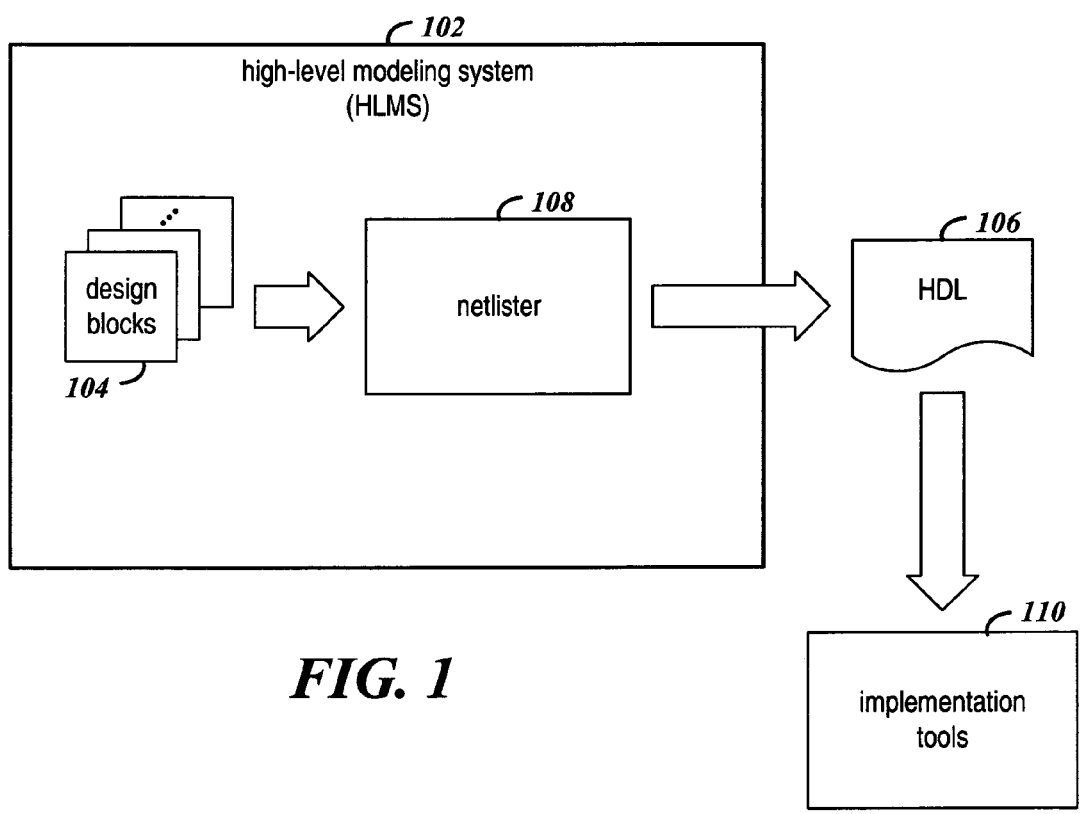
FIG. 1 is a block diagram in which blocks of a design created in an HLMS are netlisted into HDL in accordance with various embodiments of the invention.

FIG. 1 is a block diagram in which blocks of a design created in an HLMS 102 are netlisted into HDL. An example HLMS is the System Generator from Xilinx. In addition to the assembly, simulation, and debugging of an electronic circuit design, the HLMS also translates the high-level blocks 104 into HDL 106 with a netlister tool 108. The HDL may then be further processed by other implementation tools 110 such as synthesis compilers, HDL simulators, and design browsers. It will be appreciated that the HLMS may be hosted on any of a variety of computing arrangements.

The netlister generally identifies groups of blocks in the design that are similar within a rank as families. Within each family, the differences between blocks are used to generate a single entity for the family. In generating HDL code from a high-level design the netlister 108 processes the design blocks by rank. The rank of a leaf is defined to be 0. For a non-leaf block, the rank is 1+r, where r is the maximum rank of that block's subblocks.

Figure 2:
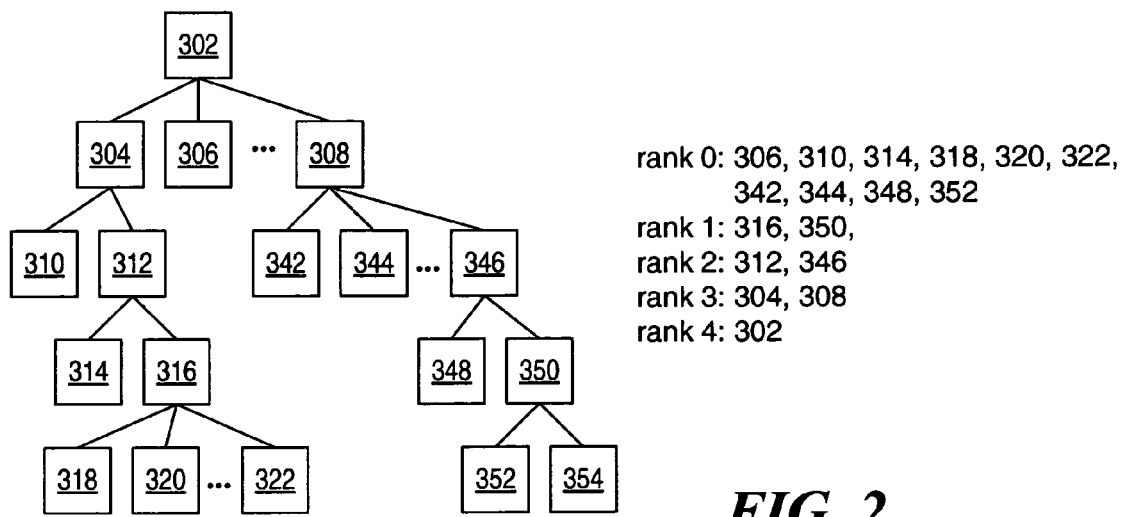
FIG. 2 shows a hierarchical view of blocks of an example design and the ranks of the blocks.

FIG. 2 shows a hierarchical view of blocks of an example design and the ranks of the blocks. Block 302 has subblocks 304, 306, and 308 (and other subblocks not illustrated), with block 306 being a leaf since it has no subblocks. Block 304 has subblocks 310 and 312, with block 310 being a leaf and block 312 having subblocks 314 and 316. Block 316 has subblocks 318, 320 and 322. Block 308 has subblocks 342, 344, and 346; block 346 has subblocks 348 and 350; and block 350 has subblocks 352 and 354.

The blocks that are leaves include 360, 310, 314, 318, 320, 323, 342, 344, 348, and 352, and the rank of the leaves is defined to be 0. The blocks of rank 1 include blocks 316 and 350. Since it can be seen from the diagram that blocks 316 and 350 each have only blocks that are leaves (leaves are rank 0) and the rank of a block is 1+r, where r is the maximum rank of that block's subblocks, blocks 316 and 350 have rank 1.

Blocks 312 and 346 have rank 2 since the maximum respective ranks of the subblocks of blocks 312 and 346 are both 1. Blocks 304 and 308 are rank 3, and block 302 is rank 4 by similar computations.

Figure 3:
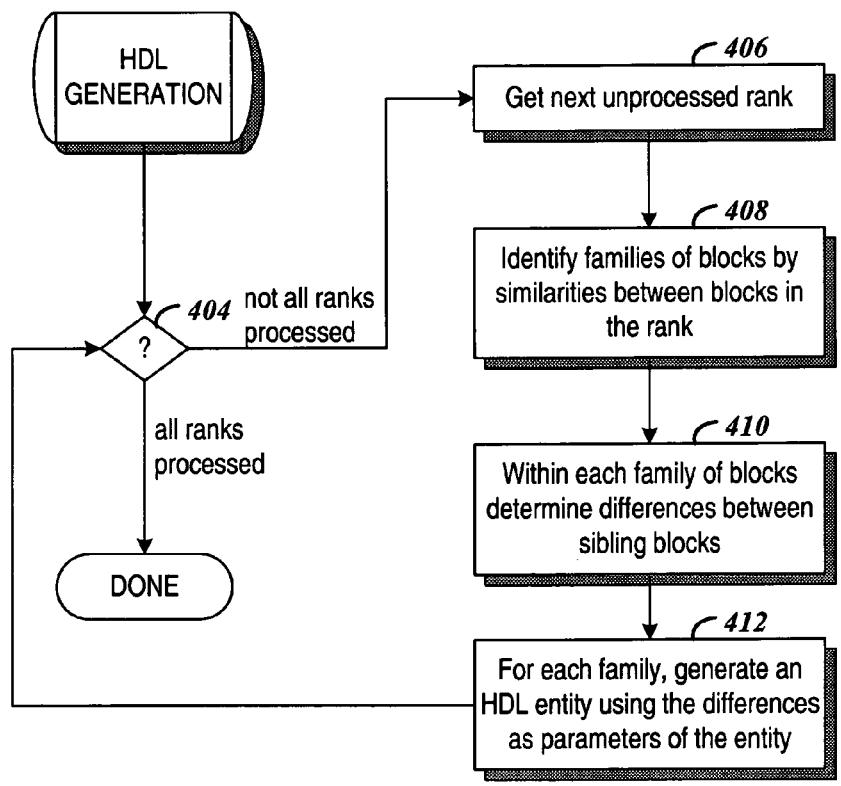
FIG. 3 is a flowchart of an example process for generating HDL from high-level design blocks in accordance with various embodiments of the invention.

FIG. 3 is a flowchart of an example process for generating HDL from high-level design blocks in accordance with various embodiments of the invention. The high-level design blocks are processed by rank, beginning with blocks of rank 0. Until all the ranks have been processed (decision step 404), the process continues by obtaining the next unprocessed rank (step 406). In one embodiment, the ranks are processed in order from rank 0 to rank n, where n is the highest rank of a block in the design.

Within the rank being processed, families of blocks are identified based on similarities between the blocks (step 408). The blocks within a family are referred to as siblings. In one example embodiment, two blocks are assigned to the same family when the only differences between the two are in the settings assigned to parameters on subblocks. In detail, this means that any two blocks within the same family must be identical in the following ways:

Each must contain the same number of subblocks.
The names assigned to subblocks must be identical.
Types of corresponding (i.e., identically-named) subblocks must be identical.
The number of ports on each block must be the same.
Names, types, and directions assigned to ports on the blocks must be identical.
The numbers of ports on corresponding subblocks must be the same.
Names, types, and directions of corresponding ports on corresponding subblocks must be identical.
Connections between ports within one block must be exactly analogous to connections within the other.

Blocks are assigned to the same family if those blocks are indistinguishable based on the stated criteria.

It will be appreciated that other embodiments may use different rules to identify families. Another approach, for example, relaxes the restriction that the names assigned to subblocks and/or ports be identical. Loosening the rules makes identifying families more costly, but gives more opportunities for reusing entities.

It will be appreciated that methods other than sorting may be used to identify families of blocks. For example, another approach may be to hash the high-level blocks using all the information in the block except for settings of parameters on subblocks. Using this approach, families consist of those blocks that hash to the same value. It will be appreciated that for hashing to be reliable, a high quality hash function (such as a cryptographic hash) is desirable.

Figure 4:
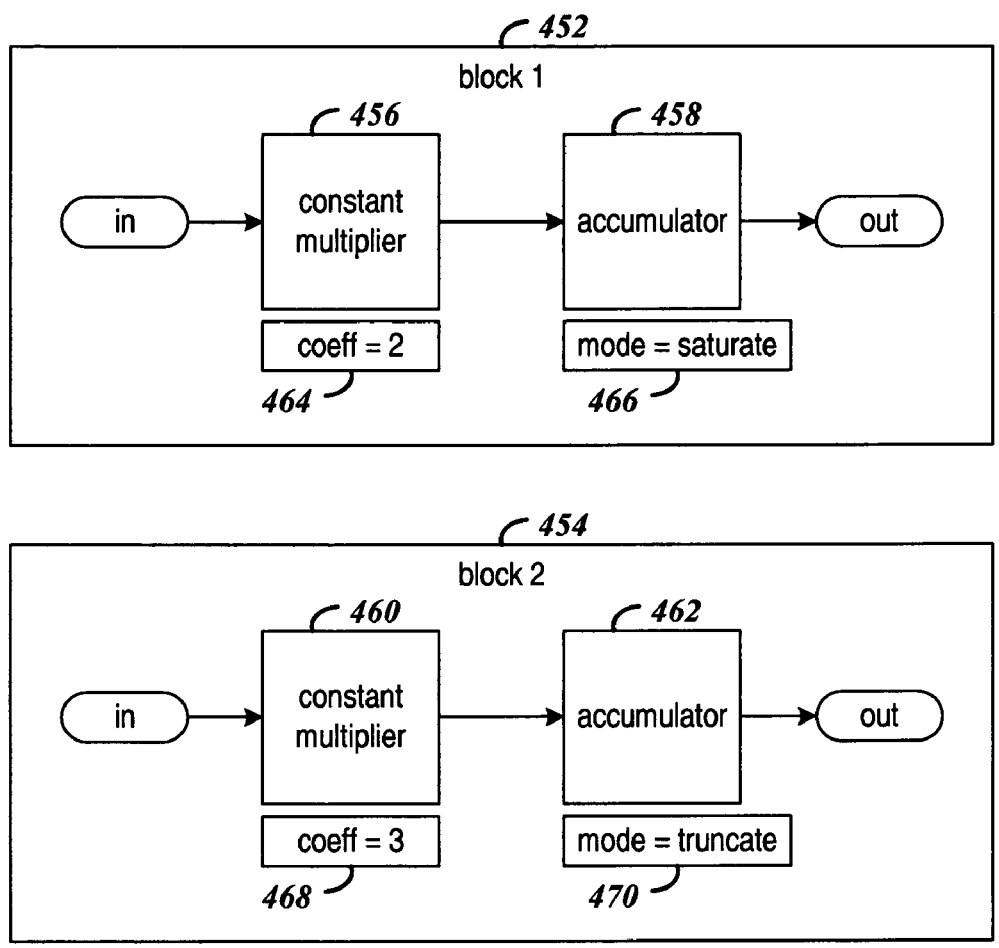
FIG. 4 illustrates two example blocks that may constitute a family.

Within each family of blocks differences between the siblings are determined. Those differences in the example embodiment are the values assigned to parameters of the subblocks inside blocks that are siblings. For example, FIG. 4 illustrates a family having two blocks 452 and 454. Each block includes a constant multiplier that drives an accumulator. Block 452 has multiplier 456 driving accumulator 458, and block 454 has multiplier 460 driving accumulator 462. Blocks 452 and 454 are identical in all respects with the exception of the parameter values for the coefficient and rounding mode parameters, shown as boxes 464, 466, 468, and 470. Block 452 has a coefficient parameter value=2, whereas block 454 has a coefficient parameter value=3. The rounding mode parameter value="saturate" for block 452, whereas the rounding mode parameter value="truncate" for block 454. Thus the differences determined by step 410 of FIG. 3 for blocks 452 and 454 are the parameter values for the coefficient and rounding parameters.

Returning now to FIG. 3, for each family identified at step 408, an HDL entity is generated (step 412) using the parameter value differences determined at step 410 as the parameters of the entity. An HDL entity is generated for each family in the rank at step 412. The process then returns to decision step 404 to determine whether there are more ranks to process.

Figure 5:
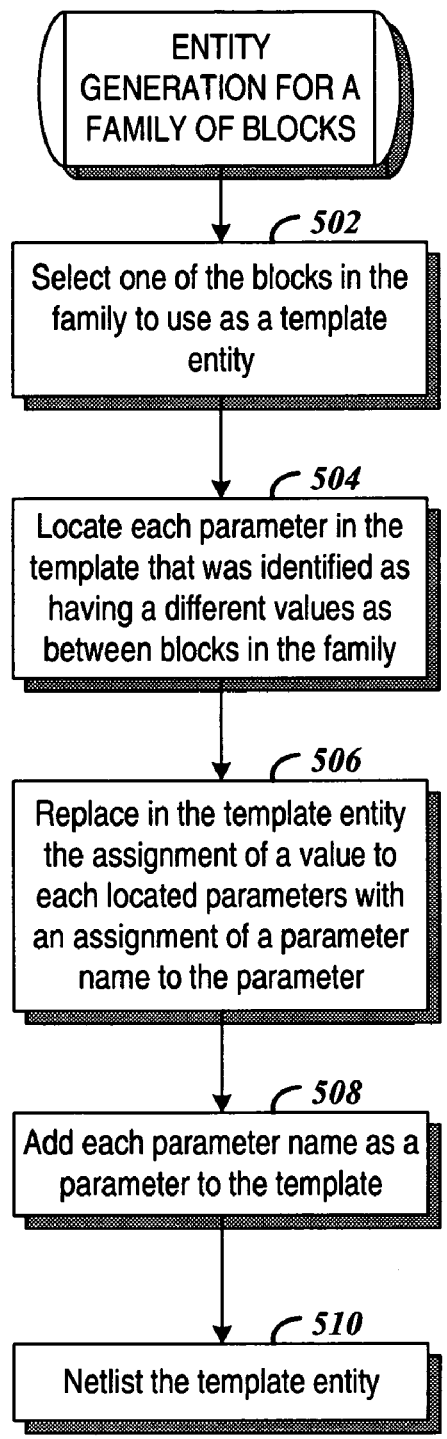
FIG. 5 is a flowchart of an example process for generating an HDL entity for a family of high-level design blocks in accordance with various embodiments of the invention.

FIG. 5 is a flowchart of an example process for generating an HDL entity for a family of high-level design blocks. One of the blocks in the family is selected for use to make a template (step 502). Because the blocks within a family are essentially identical except for settings of parameters on subblocks, any one of the blocks may be used. The template is a copy of the selected block and the template is modified in subsequent processing for preparing the template for netlisting.

Those parameters in the template that were identified as having the different values (FIG. 3, step 410) are located in the template (step 504). In the template, the value of each located parameter is replaced by a name (step 506), and that name is added as an HDL parameter to the template (step 508). Once the names have been added as HDL parameters to the template, the netlister 108 may generate HDL from the template (step 510) using existing methods.

Example 1 and Example 2 are provided for purposes of comparing the VHDL code resulting from netlisting high-level blocks without use of the present invention and with use of the invention. The code in Example 1 below illustrates the VHDL code that may be generated without use of the embodiments of the present invention. The example VHDL code is netlisted from the blocks 452 and 454 of FIG. 4. From the code it may be observed that separate entity declarations are made for block_1 and block_2, and each entity has different values assigned to the mode and coeff variables. Each of block_1 and block_2 is instantiated in the design entity.

---

```
entity block_1 is
    port (
    ...
    );
end block_1;
architecture structural of block_1 is
    ...
    begin
        accumulator: entity work.accumulator
            generic map (
                mode => saturate
                ...
            )
            port map (
                ...
            );
```

```
                cmult: entity work.cmult
                    generic map (
                        coeff = 2
                        . . .
                    )
                    port map (
                        . . .
                    );
        end structural;
========================================
entity block_2 is
    port (
        . . .
    );
end block_2;
architecture structural of block_2 is
    . . .
        begin
            accumulator: entity work.accumulator
                generic map (
                    mode => trunc
                    . . .
                )
                port map (
                    . . .
                );
            cmult: entity work.cmult
                generic map (
                    coeff = 3
                    . . .
                )
                port map (
                    . . .
                );
        end structural;
========================================
entity design is
    port (
        . . .
    );
end design;
architecture structural of design is
    . . .
        begin
            block_1: entity work.block_1
                port map (
                    . . .
                );
            block_2: entity work.block_2
                port map (
                    . . .
                );
end structural;
```

EXAMPLE 1

The code in Example 2 below illustrates the VHDL code that may be generated using any of the embodiments of the present invention. From the code it may be observed that an entity block is declared with parameters coeff and mode. It will be appreciated that the values 2 and saturate are assigned to the parameters as default values and are for purposes of illustration only. An actual application would likely have different default values. In the body of block, the parameters are assigned to variables (mode=>mode and coeff=coeff). In the architecture structural of design, block_1 and block_2 are entities of the type block. The different parameter values are provided to block_1 and block_2.

```
entity block is
    generic (
```

```
            coeff: integer := 2;
            mode: string := "saturate"
        );
        port (
            . . .
        );
end block;
architecture structural of block is
    . . .
        begin
            accumulator: entity work.accumulator
                generic map (
                    mode => mode
                    . . .
                )
                port map(
                    . . .
                );
            cmult: entity work.cmult
                generic map (
                    coeff = coeff
                    . . .
                )
                port map (
                    . . .
                );
        end structural;
========================================
entity design is
    port (
        . . .
    );
end design;
architecture structural of design is
    . . .
        begin
            block_1: entity work.block
                generic map (
                    coeff => 2,
                    mode => "saturate"
                )
                port map (
                    . . .
                );
            block_2: entity work.block
                generic map (
                    coeff => 3,
                    mode => "trunc"
                )
                port map (
                    . . .
                );
        end structural;
```

EXAMPLE 2

Those skilled in the art will appreciate that various alternative computing arrangements would be suitable for hosting the processes of the different embodiments of the present invention. In addition, the processes may be provided via a variety of computer-readable media or delivery channels such as magnetic or optical disks or tapes, electronic storage devices, or as application services over a network.

The present invention is believed to be applicable to a variety of systems for co-simulation and has been found to be particularly applicable and beneficial in event driven co-simulation using programmable logic circuitry. While various aspects of the invention have been described in terms of a specific PLD such an FPGA, it will be appreciated that the programmable logic circuitry of a PLD may be embedded in many different types of devices, and the invention is not limited to any particular type of PLD. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for translating high-level design blocks into a design specification in a hardware description language (HDL), wherein each of a plurality of the high-level design blocks has one or more parameters, each parameter having an associated parameter value, the method comprising:

assigning each of the high-level design blocks to a group, wherein a set of attributes is identical between each high-level design block in a group;

determining for each group of the high-level design blocks, a respective set of parameters that for each parameter in the set has different values in at least two high-level design blocks in the group; and generating a respective HDL specification for each group, the HDL specification having for each parameter in the set of parameters, a respective parameter input, wherein the generating of the respective HDL specification includes:

generating an HDL specification of a first high-level design block having a respective parameter for each parameter in the set of Parameters, and assigning each respective parameter to a variable in the HDL specification of the first high-level design block; and generating for each high-level design block in the group, an HDL specification of a respective entity of a type of the first high-level design block, and providing in each respective entity the associated parameter value from the respective high-level design block for each respective parameter.

2. The method of claim 1, wherein assigning each of the high-level design blocks to a group includes sorting the high-level design blocks by values of the set of attributes.

3. The method of claim 1, wherein assigning each of the high-level design blocks to a group includes applying a hash function to data describing each high-level design block.

4. The method of claim 1, wherein the set of attributes include names of blocks, types of blocks, directions of ports on blocks, numbers of subblocks, instance names of blocks, HDL entity name used to implement each subblock, names of parameters used on each subblock, and connections between subblocks.

5. The method of claim 4, wherein generating an HDL specification comprises:

making a copy of a block in a group;

for the respective set of parameters of the group having different values, replacing in the copy of the block each value assigned to a parameter with a name assigned to the parameter; and generating the HDL specification from the copy of the block.

6. The method of claim 5, further comprising, for each high-level design block in a group, generating HDL code that declares the each high-level design block as an instance of the HDL specification of the group using parameter values of the each high-level design blocks.

7. A system for translating high-level design blocks into a design specification in a hardware description language (HDL), wherein each of a plurality of the high-level design blocks has one or more parameters, each parameter having an associated parameter value, the system comprising:

means for assigning each of the high-level design blocks to a group, wherein a set of attributes is identical between each high-level design block in a group;

means for determining for each group of the high-level design blocks, a respective set of parameters that for each parameter in the set has different values in at least two high-level design blocks in the group; and means for generating a respective HDL specification for each group, the HDL specification having for each parameter in the set of parameters, a respective parameter input, wherein the means for generating a respective HDL specification includes:

means for generating an HDL specification of a first high-level design block having a respective parameter for each parameter in the set of parameters, and assigning each respective parameter to a variable in the HDL specification of the first high-level design block; and means for generating for each high-level design block in the group, an HDL specification of a respective entity of a type of the first high-level design block, and providing in each respective entity the associated parameter value from the respective high-level design block for each respective parameter.

* * * * *